United States Patent [19]

Kurgan

[11] Patent Number: 5,053,924
[45] Date of Patent: Oct. 1, 1991

[54] ELECTROMAGNETIC SHIELD FOR ELECTRICAL CIRCUIT

[75] Inventor: Jeffery F. Kurgan, Hoffman Estates, Ill.

[73] Assignee: Motorola, Inc., Schaumburg, Ill.

[21] Appl. No.: 502,365

[22] Filed: Mar. 30, 1990

[51] Int. Cl.$^5$ .......................... H05K 9/00; H01R 4/66; H01R 13/648

[52] U.S. Cl. .................................. 361/424; 439/92; 174/35 GC

[58] Field of Search ...................... 24/295, 543, 563; 174/35 GC; 361/212, 220, 424; 439/92, 95, 108

[56] References Cited

U.S. PATENT DOCUMENTS

| | | | |
|---|---|---|---|
| 2,825,010 | 2/1958 | Silverschotz | 439/92 X |
| 2,911,608 | 11/1959 | Lee | 174/35 GC X |
| 3,208,119 | 9/1965 | Seckerson | 24/295 X |
| 3,277,230 | 10/1966 | Stickney et al. | 174/35 GC |
| 4,384,165 | 5/1983 | Loving, Jr. et al. | 174/35 GC |
| 4,554,400 | 11/1985 | Schmalzl | 174/35 GC |
| 4,780,570 | 10/1988 | Chuck | 174/35 GC |
| 4,831,498 | 5/1989 | Baba | 361/424 |
| 4,890,199 | 12/1989 | Beutler | 361/424 |

FOREIGN PATENT DOCUMENTS

| | | | |
|---|---|---|---|
| 0113852 | 7/1984 | European Pat. Off. | 174/35 GC |
| 0207226 | 1/1987 | European Pat. Off. | 361/424 |
| 3436119 | 4/1986 | Fed. Rep. of Germany | 439/95 |

OTHER PUBLICATIONS

Tinnerman Brand Fasteners Catalog No. 7000F, pp. 38 and 41, copyright 1987 Eaton Corporation.

*Primary Examiner*—Leo P. Picard
*Assistant Examiner*—Michael W. Phillips
*Attorney, Agent, or Firm*—Robert H. Kelly

[57] ABSTRACT

An electromagnetic shield for absorbing electromagnetic energy generated by a circuit disposed upn a circuit board. The shield is comprised of a thermally conductive material to further provide heat-sink capabilites. Clip members releasably fastened to a flange projecting from a shielding surface formed by the shield are aligned with the ground plane of a circuit board. By maintaining the shield in a confronting relationship with the circuit board, the clip members are caused to maintain the shielding surface in electrical contact with the circuit.

7 Claims, 2 Drawing Sheets

ELECTROMAGNETIC SHIELD FOR ELECTRICAL CIRCUIT

BACKGROUND OF THE INVENTION

The present invention relates generally to shielding apparatus for electromagnetic shielding, and, more particularly, to an electromagnetic shield having a convective, heat-dissipative surface for dissipating heat generated during operation of the electrical circuit.

High frequency electromagnetic signals are generated during operation of an electrical circuit containing a high frequency oscillator. These electromagnetic signals are a byproduct of normal operation of the electrical circuit, and are undesirable as the generated signals can interfere with normal functioning of other electrical circuits. Such interference, and the unwanted effects thereof, is well known to users of electronic equipment.

In order to minimize the effects of the interference, electromagnetic shielding material is oftentimes positioned to cover electrical circuits. The shielding material absorbs the electromagnetic signals generated by the electrical circuits which the shielding covers, as well as signals generated by other circuits. The shielding material is frequently comprised of a metallic, or other electrically conductive, material, and may take the form of a planar surface or a housing completely enclosing the electrical circuit.

One known type of shield for shielding electromagnetic energy consists of a metallic plate member positioned over the electromagnetic energy-producing electrical circuit. The metallic plate member absorbs the electromagnetic energy generated during operation of the circuit. Side flanges extend downwardly from the plate member, and a conductive braid material, or conductive-rubber material, supported by the flanges, electrically connects the shield to the electrical circuit. Typically, the shield is electrically connected to the ground plane of the electrical circuit, or some other such common reference plane; otherwise, the shield can function as an antenna for receiving electromagnetic energy transmitted by other electrical circuits.

The braid, or conductive-rubber material, is physically connected to the flanges extending downwardly from the plate member by inserting the braid, or conductive-rubber material, into an indentation formed in bottom surfaces of the flanges. Use of the braid, or conductive-rubber material, is desired in order to ensure that an electrical connection between the shield and the circuit is maintained.

Another byproduct of normal operation of an electrical circuit is thermal energy, i.e., heat. If not dissipated, a buildup of heat can cause abnormal operation of the electical circuit, and can even damage the component elements of the circuit. Therefore, a means for dissipating heat is oftentimes positioned proximate to the electrical circuit. For example, thermally conductive materials forming heat sinks containing convective surfaces are oftentimes positioned proximate to an electrical circuit to permit dissipation of heat energy conducted thereto.

Electronic equipment containing one or many electrical circuits is being increasingly miniaturized in order to permit the equipment to be housed in ever-smaller packages. In order to permit such miniaturization, the aforementioned electromagnetic shielding apparatus and heat dissipation apparatus must similarly be miniaturized to fit in the ever-smaller packages. For instance, electromagnetic shielding apparatus has been developed which also functions as a heat sink to dissipate heat generated during operation of an electrical circuit.

One such example of electronic equipment which has been increasingly miniaturized is a handheld, portable radiotelephone. As the radiotelephone package is increasingly miniaturized, the electromagnetic shielding apparatus and heat dissipation apparatus housed within the radiotelephone housing must be commensurately miniaturized.

Shielding apparatus, such as the shield described hereinabove, may be used in a portable radiotelephone. Design constraints, however limit further miniaturization of such a shield. The metallic plate member forming a portion of the shield and flange projecting therefrom are typically constructed by a die-cast or extrusion process. While the dimensions of the flange portions formed during a die cast process may be as thin as 0.025 inch, or even thinner, the flange must be wide enough to form a channel to support the braid or conductive-rubber material. Because the braid or conductive-rubber material is connected to the bottom of the flange portion by forming an indentation into the bottom end of the flange portion, and because the braid or conductive-rubber material is of dimensions of 0.015 inch, the width of the indentation formed in the bottom end of the flange portion must be of a corresponding width. The side walls forming the indentation must be of dimensions of 0.025 inch for reasons of process limitations, and the resultant flange width must be, accordingly, at least 0.065 inch. Because the flange portions of the shield typically extend about the perimeter of the electrical circuit, the total flange area in both the widthwise and the lengthwise direction of the shield plate must be two times 0.065 inch, or 0.130 inch. As mentioned hereinabove, because the handheld radiotelephone is becoming increasingly miniaturized, this area required for the flange portions of the shield plate is increasingly becoming a design constraint limiting further miniaturization of the radiotelephone package. The size requirements of shielding apparatus for electrical circuits of other electronic devices is similarly becoming a design constraint limiting further miniaturization.

Accordingly, improved means and methods for shielding and for dissipating heat are therefore required in order to permit increased miniaturization of electronic equipment.

SUMMARY OF THE INVENTION

It is accordingly an object of the present invention to provide shielding apparatus of reduced dimensions for an electrical circuit.

It is a further object of the present invention to provide shielding apparatus of reduced dimensions which additionally provides convective surface areas for dissipating heat generated during operation of an electrical circuit.

It is a still further object of the present invention to provide an improved connecting means for electrically connecting an electromagnetic energy-absorptive shield to an electrical circuit to permit proper shielding of electromagnetic energy.

In accordance with the present invention, therefore, a shield for isolating an electrical circuit is disclosed. A shielding surface comprised of an electromagnetic energy-absorptive material is positioned in a confronting relationship with the electrical circuit and covers at least a portion of the electrical circuit. The shielding surface is electrically connected with a circuit path of the electrical circuit. When positioned in the confronting relationship with the electrical circuit, and suitably aligned with the circuit path thereof to allow electrical connection thereto, electromagnetic energy radiated by or transmitted towards the electrical circuit is absorbed.

Preferably, the shielding surface is comprised of a thermally conductive material such that the shielding surface further forms a convective surface whereat heat generated during operation of the electrical circuit is dissipated.

BRIEF DESCRIPTION OF THE DRAWINGS

The present invention will be better understood when read in light of the accompanying drawings in which.

DETAILED DESCRIPTION OF THE PREFERRED EMBODIMENTS

Figure 1:
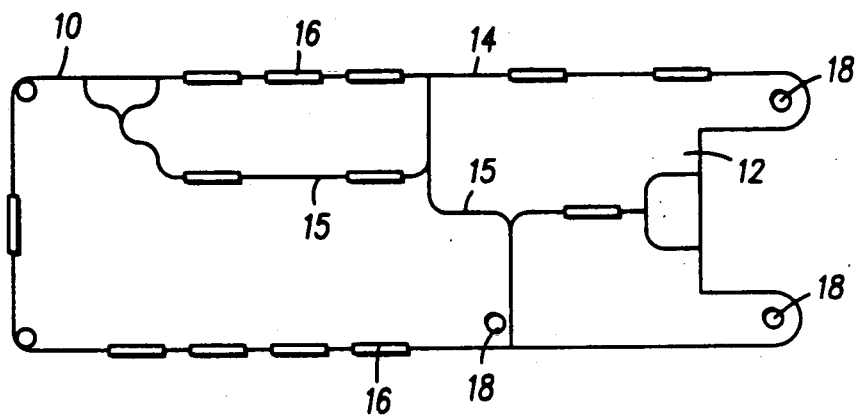
FIG. 1 is a plan view of the shield of the present invention.

Referring first to FIG. 1, there is shown a plan view of the shield, referred to generally by reference numeral 10, of the present invention. Shield 10 is comprised of plate 12 having face surfaces thereof of widthwise and lengthwise dimensions to cover substantially an electrical circuit, such as an electrical circuit disposed upon a printed circuit board. Shield 10 of FIG. 1 is elongated in the lengthwise direction. It is to be noted, however, that the dimensions of the plate 10 preferably correspond to the dimensions of the circuit (or circuits) which shield 10 isolates. Therefore, plate 12 may take the form of any of many other shapes.

Side flange 14 extends about a perimeter of shield 10. In the preferred embodiment of the present invention, plate 12 and flange 14 are integrally formed during a die-cast process, thereby forming a unitary construction of a single material. Shield 10 of FIG. 1 further includes side-spanning flanges 15, also preferably integrally formed with the plate 12 during a die-cast process. Side-spanning flanges 15 permit plate 12 to isolate several different circuits disposed upon a circuit board from one another.

A plurality of clip members 16 are connected to flanges 14 or 15 at selected locations along the respective flanges. FIG. 1 also illustrates apertures 18 formed at opposite corner portions, and at selected locations along the length, of plate 12. Apertures 18 permit insertion of threaded shaft members therethrough.

Plate 12 is comprised of a material which absorbs electromagnetic energy of radio frequencies, and may be comprised of any of many metallic materials, such as a zinc or, preferably, magnesium alloy (or,e.g., a plastic with a metallic coating). Magnesium is a preferred material of construction due to the lightweight characteristic thereof. Flanges 14 and 15 are similarly comprised of an electromagnetic energy-absorptive material, and, as mentioned previously, are preferably integrally formed with the plate 12.

Figure 3:
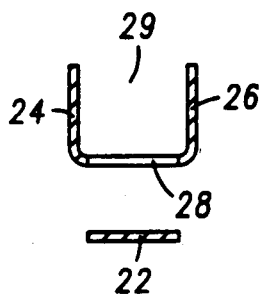
FIG. 3 is a sectional view of the clip member of FIG. 2 taken along lines III—III thereof.
Figure 2:
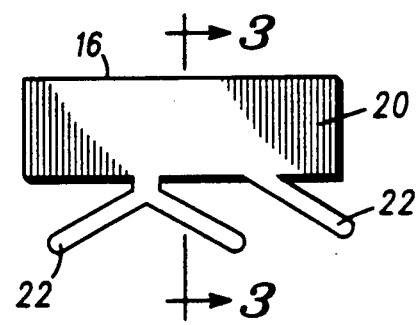
FIG. 2 is a side, elevational view of a single clip member forming a portion of the shield of the present invention.

Turning now to FIG. 2, a side elevational view of a single clip member 16 is illustrated. Clip member 16 is comprised of an electrically conductive material, and includes fastening portion 20 and projecting tabs 22 projecting therefrom. Fastening portion 20 permits connection of clip member 16 to flanges 14 or 15, and projecting tabs 22 engage with a circuit path of an electrical circuit positioned beneath the clip to provide an electrical contact therewith. In the preferred embodiment, and as illustrated in the sectional view of FIG. 3, fastening portion 20 comprises a U-shaped base having legs 24, 26, and 28 which define a channel 29 therebetween. The channel 29 formed thereby is of dimensions suitable to permit positioning of portion 20 of clip 16 about flange 14 or 15 to be fastened thereto.

Projecting tabs 22 project from leg 28 of portion 20. In the preferred embodiment, clip members 16 are constructed by a progressive die process, and projecting tabs 22 are constructed from portions of leg 28 of the U-shaped base comprising portion 20. Tabs 22 are formed by stamp-cutting three sides of a tab 22 pattern out of the leg 28 of clip fastening portion 20, and then bending the tab 22 to project in the desired direction. Three tabs are cut from leg 28 of each clip member 16 in the preferred embodiment of the present invention. Significantly, because clip members 16 are fastened to flanges 14 and 15 by merely positioning portions 20 thereof about flange 14 or 15, no soldering is required in order to fasten clip member 16 to the flange. Additionally, clip members may be positioned at any location along the flange 14 or 15 and then fastened thereto. The clip members 16 may also be repositioned and refastened to flanges 14 or 15 as desired, as clip members 16 are releasably engagable to the flanges.

In the preferred embodiment of the present invention, clip members 16 are comprised of a beryllium-copper material which permits repeated, large radial movement of projecting tabs 22 without fatigue failure, while maintaining platability to reduce galvanic and/or oxidation corrosion.

Clip members 16 additionally conduct thermal energy generated during operation of electrical circuits positioned therebeneath to the plate 12. The surface of plate 12 forms a convective surface to aid in dissipation of the thermal energy conducted thereto. Plate 12 of shield 10 thereby functions not only to absorb electromagnetic energy, but, additionally, as a heat sink for dissipating conducted, thermal energy.

Figure 4:
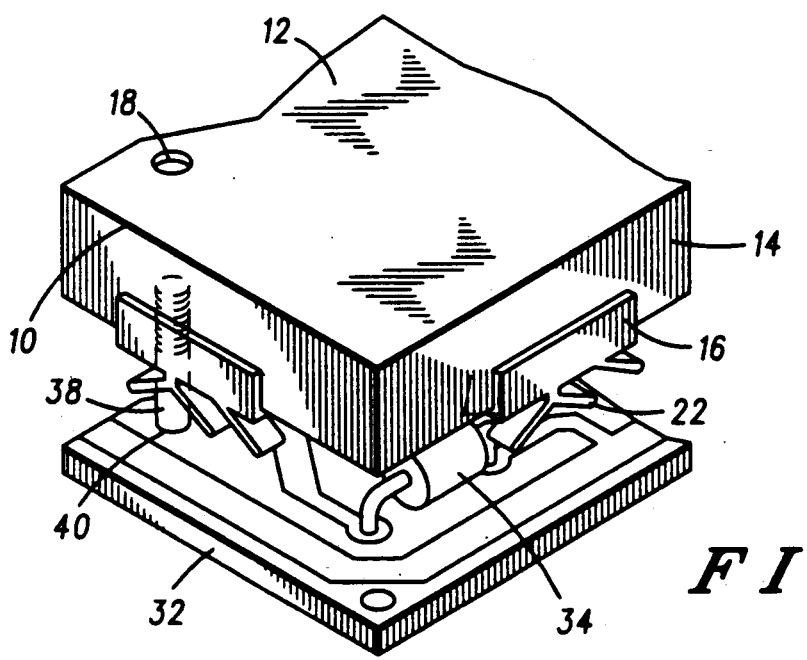
FIG. 4 is an exploded, cutaway view of the shield of the present invention positioned above an electrical circuit disposed upon a printed circuit board illustrating the relationship between the shield of the present invention and the electrical circuit.

Turning now to the exploded, cutaway view of FIG. 4, shield 10 of the present invention is positioned above printed circuit board 32 upon which electrical circuits, such as electrical circuit 34 are disposed. Conventionally, a printed circuit board, such as circuit board 32, contains a common ground path 36 etched thereon to which all circuits disposed on the board 32 are connected. It is to t' s common ground path 36 that the projecting tabs 22 of clip member 16 contact in the preferred embodiments. It is to be noted, of course, that other points of contact are similarly possible.

Preferably, flanges 14 and 15 formed integral with plate 12 during a die-cast process, correspond in pattern to the common ground path 36 of printed circuit board 32 upon which shield 10 is positioned. By merely aligning the clip members 16 with the common ground path 36 of printed circuit board 32, and by placing shield 10 in a confronting relationship with the circuit board 32, shield 10 becomes electrically connected to the electrical circuit by contact of tabs 22 of clips 16 to ground path 36. Shield 10 thereby absorbs electromagnetic energy generated by electrical circuit 34 and absorbs electromagnetic energy transmitted thereto. Heat energy generated by the electrical circuits positioned beneath shield 10 is conducted through flanges 14 and 15, and is dissipated by the convective surface formed by the surface of plate 12. Also illustrated in FIG. 4 is threaded shaft member 38 which, when inserted through aperture 18 of shield 10, and through aperture 40 extending through circuit board 32, affixes shield 10 to the circuit board 32 in the aligned, confronting relationship.

Figure 5:
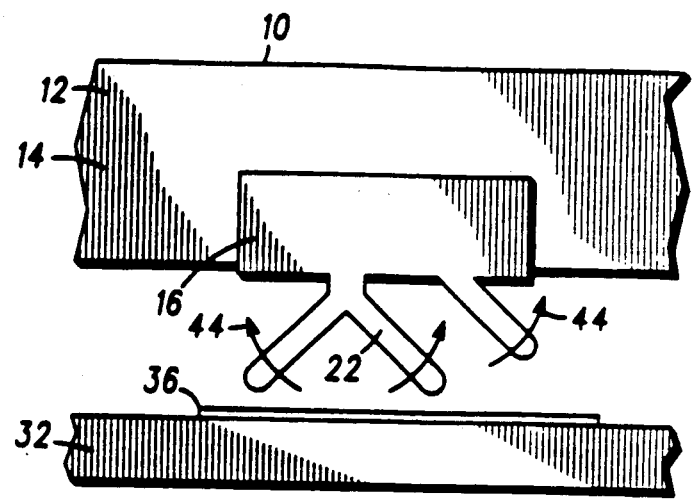
FIG. 5 is an enlarged view, in elevation, illustrating the connection between the clip member forming a portion of the present invention and a circuit path of an electrical circuit disposed upon a printed circuit board.

FIG. 5 is an enlarged view, in elevation, of a single clip member 16 fastened to flange 14 of shield 10. Aligned beneath tabs 22 is common ground path 36 of printed circuit board 32. As previously mentioned, clip member 16 preferably includes three projecting tabs 22 stamped from leg 28 of the fastening portion 20 of clip member 16 during a progressive die process; other numbers of projecting tabs 22 and other means for the formation thereof, are, of course, possible. Once clip member 16 is suitably aligned with common ground path 36, shield 10 is lowered into a confronting relationship upon the circuit board 32. Placement of shield 10 upon circuit board 32 causes radial deflection of projecting tabs 22 in directions illustrated by arrows 44 of the figure. Projecting tabs 22 thereby electrically contact with common ground path 36 to provide an electrical connection between ground 36 and surfaces of plate 12 of shield 10. Shield 10 thereby functions to absorb electromagnetic energy generated by an electrical circuit 34 positioned therebeneath, and to absorb electromagnetic energy transmitted towards electrical circuit 34 generated by other electrical circuits.

Vibrational forces, droppage forces, and bending stresses occurring due to thermal bending of circuit board 32 are absorbed by tabs 22. Similarly, forces caused by stress relaxation (creep) of the die cast housing (or extruded housing or plastic molded housing) are also absorbed by tabs 22. Because, in the preferred embodiment, clip member 16 is comprised of a beryllium-copper material, these forces do not cause fatigue failure of projecting tabs 22.

Repeated radial movement of projecting tabs 22 resulting from the aforementioned forces is therefore permitted while maintaining an electrical connection between ground path 36 and plate 12 of shield 10. Additionally, because the clip member 16, flanges 14 and 15, and plate 12 are comprised of a thermally conductive material, heat generated during operation of an electrical circuit, such as circuit 34, is convected to surface 12 whereat the heat is dissipated. Therefore, not only does shield 10 absorb electromagnetic energy, but, additionally, shield 10 functions as a heat sink to dissipate heat generated during operation of an electrical circuit.

Figure 6:
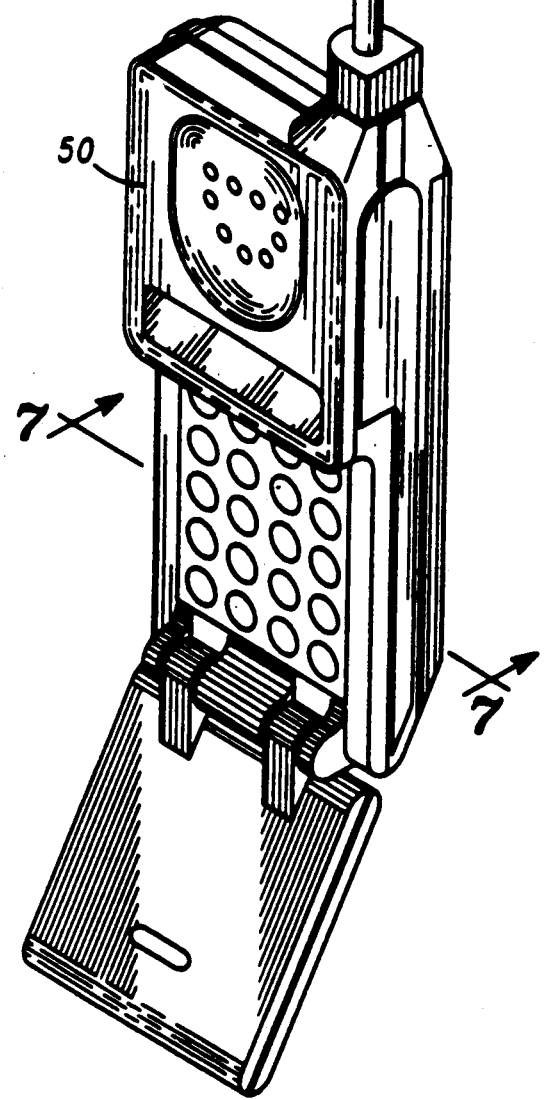
FIG. 6 is an isometric drawing of a handheld portable radiotelephone which may employ the shield of the present invention.

Turning now to the isometric view of FIG. 6, a portable radiotelephone, referred to generally by reference numeral 50, is shown. Radiotelephone 50 may, for example, be similar to a Motorola radiotelephone, model no. F09NFD8444AA, utilized in a cellular radiotelephone system. Radiotelephones, such as radiotelephone 50, have been increasingly miniaturized to increase the portability thereof. The shield of the present invention may be advantageously utilized as a component portion of radiotelephone 50. Shield 10 not only provides an electromagnetic shield and a heat sink having reduced dimensions, but, additionally, due to the construction of clip member 16, shield 10 functions well in an environment where vibrational forces, droppage forces, and thermal bending of circuit boards contained within radiotelephone 50 are frequent.

Figure 7:
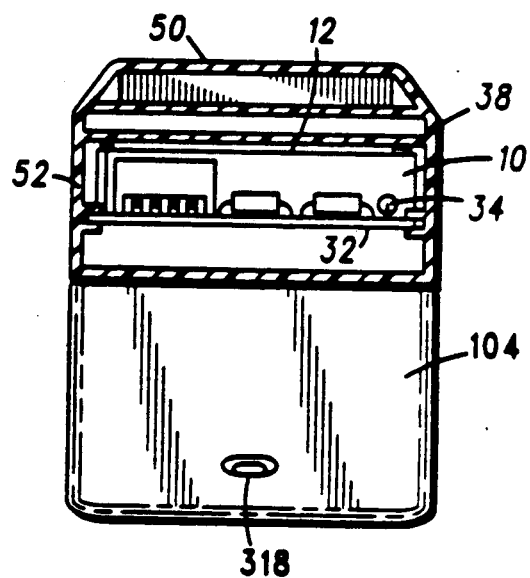
FIG. 7 is a sectional view taken along lines VII—VII of FIG. 6 showing the placement of a circuit board and the shield of the present invention.

FIG. 7 illustrates a sectional view taken along lines 7—7 of FIG. 6. This sectional view illustrates the positioning of the shield 10 of the present invention upon circuit board 32 to absorb electromagnetic energy radiated by electrical circuit 34 as well as electromagnetic energy transmitted thereto. Additionally, because shield 10 is comprised of a thermally conductive material, heat generated during operation of electrical circuit 34 is conducted to a convective surface formed by the surface of plate 12 of the shield 10 whereat the thermal energy is dissipated by convection. Circuit board 32 is affixed to housing 52 of the radiotelephone 50 in any conventional manner. Flanges 14 and 15, integrally formed with plate 12 during a die-cast process, are patterned to correspond with a common ground path 36 of the circuit board 32. Threaded shaft members 38 extending through apertures 18 and 40 permit the shield 10 to be maintained in the confronting relationship with the circuit 34. Projecting tabs 22 electrically contact with ground path 36 to provide an electrical connection between elongated plate 12 of shield 10 and electrical circuit 34. Vibrational, droppage and thermal bending forces, and material stress relief (creep) forces are absorbed by deflection of projecting tabs 22, and an electrical connection between plate 12 and circuit 34 is maintained.

While the present invention has been described in connection with the preferred embodiment shown in the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A shield for isolating an electrical circuit, the electrical circuit having at least one circuit path and being disposed upon a circuit board, said shield comprising:

means forming a shielding surface having a face surface for covering at least a portion of the electrical circuit, said shielding surface formed thereby being comprised of an electrically-conductive, electromagnetic wave-absorptive material for absorbing electromagnetic energy radiated by or towards the electrical circuit, the shielding surface further having flange portions extending beyond the face surface thereof for alignment with the circuit path of the electrical circuit;

means forming at least one clip member comprised of an electrically-conductive material and formed of parallel-extending side legs interconnected by a bottom leg, said parallel-extending side legs and said bottom leg together forming a U-shaped cross-section and defining a channel between the parallel-extending side legs, said channel defined thereby being of widthwise dimensions approximating, but slightly less than, widthwise dimensions of the flange portions of the shielding surface, thereby releasably fastening the parallel-extending side legs to the flange portions by elastic deformation of the parallel-extending side legs therearound whereby the parallel-extending side legs exert compressive forces thereagainst;

at least one projecting tab integral with said at least one clip member comprised of an electrically-conductive material pivotally, and electrically, fastened at a first end thereof to the bottom leg of the clip member capable of pivotal movement about an axis formed in a plane defined by the bottom leg and substantially perpendicular to the planar directions of the parallel-extending side legs, such that, with the clip member fastened to the flange portions of the shielding surface, alignment of the flange portions of the shielding surface with the circuit path of the electrical circuit disposed upon the circuit board, and lowering of the shielding surface to position the flange portions thereof in tandem with the circuit path, causes pivotal movement of the at least one projecting tab to position the at least one projecting tab in a confronting relationship with the circuit board along at least a portion of the length thereof to electrically connect the shielding circuit with the circuit path of the electrical circuit.

2. The shield of claim 1 wherein said shielding surface formed by the means for covering is further comprised of a thermally conductive material for forming a convective surface thereby.

3. The shield of claim 2 wherein said shielding surface is comprised of a magnesium alloy material.

4. The shield of claim 1 wherein said at least one projecting tab is comprised of a portion of the bottom leg of the clip member.

5. The shield of claim 1 wherein said electrically-conductive electromagnetic wave-absorptive material comprising the shielding surface absorbs signals of radio frequencies.

6. The shield of claim 1 further comprising threaded shaft members interconnecting the shielding surface and the circuit board for maintaining the flange portions of the shielding surface in tandem with the circuit path of the electrical circuit disposed upon the circuit board.

7. A clip member for electrically connecting a circuit path of an electrical circuit with an electromagnetic shielding surface formed of an electrically-conductive, electromagnetic wave-absorptive material and covering at least a portion of said electrical circuit, the shielding surface further having flange portions extending beyond a face surface thereof, said clip member comprised of:

parallel-extending side legs interconnected by a bottom leg, said parallel-extending side legs and said bottom leg comprised of an electrically-conductive material and together forming a U-shaped cross-section and defining a channel between the parallel-extending side legs, said channel defined thereby being of widthwise dimensions approximating, but slightly less than, widthwise dimensions of the flange portions of the shielding surface to be used with said clip member thereby to permitting releasable fastening of the parallel-extending side legs to the flange portions by elastic deformation of the parallel-extending side legs therearound whereby the parallel-extending side legs exert compressive forces thereagainst:

at least one projecting tab integral with said at least one clip member comprised of an electrically-conductive material pivotally, and electrically, fastened at a first end thereof to the bottom leg of the clip member capable of pivotal movement about an axis formed in a plane defined by the bottom leg and substantially perpendicular to the planar directions of the parallel-extending side legs, such that, with the clip member fastened to the flange portions of the shielding surface, alignment of the flange portions of the shielding surface with the circuit path of the electrical circuit disposed upon the circuit board, and lowering of the shielding surface to position the flange portions thereof in tandem with the circuit path, causes pivotal movement of the at least one projecting tab to position the at least one projecting tab in a confronting relationship with the circuit board along at least a portion of the length thereof to electrically connect the shielding circuit with the circuit path of the electrical circuit.

* * * * *